United States Patent
Bashar

(10) Patent No.: US 6,924,709 B2
(45) Date of Patent: Aug. 2, 2005

(54) INTEGRATED RELAXATION OSCILLATOR WITH IMPROVED SENSITIVITY TO COMPONENT VARIATION DUE TO PROCESS-SHIFT

(75) Inventor: Aniruddha Bashar, Tucson, AZ (US)

(73) Assignee: Standard Microsystems Corporation, Hauppauge, NY (US)

(*) Notice: Subject to any disclaimer, the term of this patent is extended or adjusted under 35 U.S.C. 154(b) by 118 days.

(21) Appl. No.: 10/683,621

(22) Filed: Oct. 10, 2003

(65) Prior Publication Data

US 2005/0077971 A1 Apr. 14, 2005

(51) Int. Cl.[7] ............................................... H03B 5/24
(52) U.S. Cl. ..................................... 331/143; 331/175
(58) Field of Search ........................ 331/111, 129–131, 331/143, 175

(56) References Cited

U.S. PATENT DOCUMENTS

| | | | |
|---|---|---|---|
| 4,219,787 A | 8/1980 | Schade, Jr. | |
| 4,377,790 A | 3/1983 | Zobel et al. | |
| 4,413,238 A | 11/1983 | Pace | |
| 4,594,565 A | 6/1986 | Barreras | |
| 4,868,525 A | 9/1989 | Dias | |
| 5,497,127 A | 3/1996 | Sauer | |
| 6,337,605 B1 * | 1/2002 | Divoux | 331/176 |
| 6,356,161 B1 | 3/2002 | Nolan et al. | |
| 6,720,836 B2 | 4/2004 | Lin | |
| 6,750,729 B2 | 6/2004 | Kim et al. | |
| 6,771,135 B2 | 8/2004 | Kubo et al. | |

OTHER PUBLICATIONS

"A Low–Voltage IC Timer", IEEE Journal of Solid State Circuits, vol. SC–13, No. 6, Dec. 1978, pp. 847–852, Camenzind, H. et al.

"Redesigning the old 555", IEEE Spectrum, vol. 34, No. 9, Sep. 1997, pp. 80–85; Camenzind, H.

"Relaxation Oscillator", Introductory Electronic Notes, The University of Michigan–Dearborn, Copyright: M H Miller: 2000 revised, http://www.engin.umd.umich.edu/~fmeral/ELECTRONICS I/0100 Relaxation Osc./0100 Relaxation Osc.pdf.

* cited by examiner

*Primary Examiner*—David Mis
(74) *Attorney, Agent, or Firm*—Meyertons Hood Kivlin Kowert & Goetzel, P.C.; Jeffrey C. Hood

(57) ABSTRACT

A system and method for designing an integrated relaxation oscillator that exhibits reduced change in the frequency of oscillation caused by process variation. Improved sensitivity to component variation due to process shift is achieved through using more than one structure type when implementing the resistors affecting the RC time constant and threshold (trip point) voltages of the oscillator. Structure types are related to the fabrication process and for a CMOS process include, but are not limited to n-diffusion, p-diffusion, n-well, p-well, pinched n-well, pinched p-well, poly-silicon and metal. Each structure type exhibits statistically independent process variations, allowing for application of Lyapunov's extension of the Central Limit Theorem for statistically uncorrelated events to desensitize the effect from different possible causes. Thus, improvement in the performance of the oscillator may be achieved with a reduced trim requirement and without using external precision resistors.

20 Claims, 2 Drawing Sheets

INTEGRATED RELAXATION OSCILLATOR WITH IMPROVED SENSITIVITY TO COMPONENT VARIATION DUE TO PROCESS-SHIFT

BACKGROUND OF THE INVENTION

1. Field of the Invention

This invention relates generally to the field of analog integrated circuit design and, more particularly, to oscillator and timer design.

2. Description of the Related Art

Oscillators play a prominent role in the functionality of a large portion of today's analog and digital systems. Typically, oscillators, also referred to as astable multivibrators, are electronic circuits that convert energy from direct-current sources into periodically varying electrical signals, or voltages. In other words, an oscillator typically operates by utilizing the electrical behavior of its circuit elements to convert a steady state input signal into a periodic, time variant output signal. In some implementations the signal produced by an oscillator may be sinusoidal in appearance, such as a sine wave, in other implementations it may appear as a square wave, triangular wave, or a variety of other repeatable signals. Many of today's integrated circuits that require oscillators, such as timer circuits and Phase-Locked Loops (PLLs), need to include the oscillators on-chip in order to meet cost and area requirements. The behavior of such on-chip oscillators is typically affected by the technology used to fabricate the integrated circuit. For example, many widely used fabrication processes today are based on complementary metal-oxide-semiconductor (CMOS) technology, where each specific qualified CMOS process varies slightly from another.

One common type of oscillator is the relaxation oscillator. Typically a relaxation oscillator achieves its oscillating output by charging a capacitor to some event or switching threshold. The event discharges the capacitor, and its recharge time determines the repetition time of the events or switching. Similarly, an oscillating output could also be achieved by discharging instead of charging the capacitor to reach the event or switching threshold. Typically the capacitor is charged through a resistor, where the values of the resistor and the capacitor, referred to as the RC time constant, determine the rate, or frequency, of the oscillation. For example, decreasing the value of the resistor may increase the oscillation frequency, and increasing the value of the resistor may decrease the oscillation frequency. In the case of a typical relaxation oscillator whose frequency is determined by an RC time constant, any fabrication process variation on any of the parameters (namely R and C) will typically result in a shift in the oscillator frequency.

One widely used oscillator topology in the art is found in the popular IC555 timer circuit, which has been on the market since the mid-Nineteen Sixties. The IC555 timer is frequently configured in a free-running mode, where a capacitor between an upper threshold, which is determined by a first comparator, and a lower threshold, which is determined by a second comparator, is resistively charged and discharged. The frequency of oscillation of the timer may be affected by various factors, including finite comparator gain and offset voltage, temperature variations, and process shift in silicon processing.

The IC555 has been widely used in the art, and methods have been developed to minimize changes in the frequency of oscillation resulting from temperature effects. Efforts have also been made to counteract the effects of finite comparator gains and offset voltages, by making the frequency of oscillation a value independent of the supply voltage used by the respective circuits. Typically, these solutions employ discrete precision resistor and capacitor components that are external to the oscillator circuit in order to avoid the problems caused by process shift. As a result, these solutions are generally not ideal for systems or circuits that require an integrated oscillator with reduced pin counts. When working within generally tight operational tolerances, a trim capability of the circuit may be required to make the necessary adjustments needed for achieving proper circuit operation over variations present in silicon processing.

Trimming is typically accomplished by cutting (or blowing) fuses, which results in a permanent change. The outputs of the fuses are generally a couple of digital bits, also called trim bits. The trim bits are sometimes implemented as a programmable option, where during power-up they are latched to pre-specified levels. For greater flexibility the trimming is many times performed using a combination of both methods. Typically, when performing trimming for an oscillator, the digital bits select different RC time constants to set the correct output frequency regardless of any process shift of the internal integrated components. Generally a bank of capacitors and/or a bank of resistors are employed for selecting the appropriate RC time constant. If the effects of the process shift are diminished, the trim range can be effectively decreased leading to smaller area requirements for the capacitor bank and/or resistor banks.

Therefore, there exists a need for a system and method for designing an integrated relaxation oscillator that exhibits minimal change in the frequency of oscillation caused by process variation, by improving sensitivity to component variation due to process shift while minimizing the area requirements for capacitor banks and/or resistor banks used during trimming.

SUMMARY OF THE INVENTION

In one set of embodiments, the invention comprises a system and method for designing an integrated oscillator circuit while minimizing the effect of the resistor variation in the frequency of oscillation caused by a shift in the manufacturing process. In one embodiment, an oscillator is designed using two different structural types of resistors that are comprised in the 'RC time constant' of the frequency of oscillation. The structural types may be selected within an available process and may include p-diffusion (p+), n-diffusion (n+), n-well, p-well, pinched n-well, pinched p-well, poly-silicon (p doped or n doped), and metal (layer 1, 2, 3 or 4) for a given CMOS process technology, for example. The different types of resistors that are selected will have, by type, statistically independent process variations. In one embodiment, the resistor coupled to the oscillator output and comprised in the RC time constant is divided into two equal parts of each structural type. The contribution made to the frequency variation by the process shift of the resistor types can be considered independent events that follow a Gaussian probability distribution. The combined effect may be a distribution with standard deviation equal to the square root of the sum squares of the individual standard deviations. By obtaining standard deviations that are close, the overall standard deviation may decrease by approximately 29% compared to the standard deviation resulting from using only a single type of resistor.

A typical relaxation oscillator, such as an IC555 type timer, may include a resistor string with equal values to generate two threshold voltages, in one case two-thirds of a supply voltage and one-third of the supply voltage, as inputs to a window comparator. In one embodiment, the comparator outputs are tied to the inputs of an SR-flip-flop, which may drive a charging or discharging of a capacitor in a corresponding RC path external to the resistor string. For proper functioning the capacitor voltage may be regulated to fall within the range of the threshold voltages. The RC time constant may determine the frequency of the pulse at the output of the SR-flip-flop, which may eventually be used as the oscillator output. Any increase in the frequency due to an increase in sheet resistance of the resistor external to the resistor string may partially be compensated by a decrease in the window of threshold voltages. In one embodiment, the resistor outside the resistor string is made of a single type, but the resistor string is broken up into two different types. An improvement of about 34% in standard deviation may thus be obtained. In an alternate embodiment, the resistor string is made of a single type while the resistor external to the resistor string is broken into different types.

Thus, various embodiments of the invention may provide a means for designing an integrated relaxation oscillator that exhibits minimal change in the frequency of oscillation caused by process variation. Improved sensitivity to component variation due to process shift is achieved by selecting the resistors included in the RC time constant of the oscillator to be of different structural types. Each type will exhibit statistically independent process variations. Thus, improvement in the performance of the oscillator may be achieved with a reduced trim requirement and without using external resistors. The invention utilizes Lyapunov's extension of the Central Limit Theorem for statistically uncorrelated events to desensitize the effect from some possible causes.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
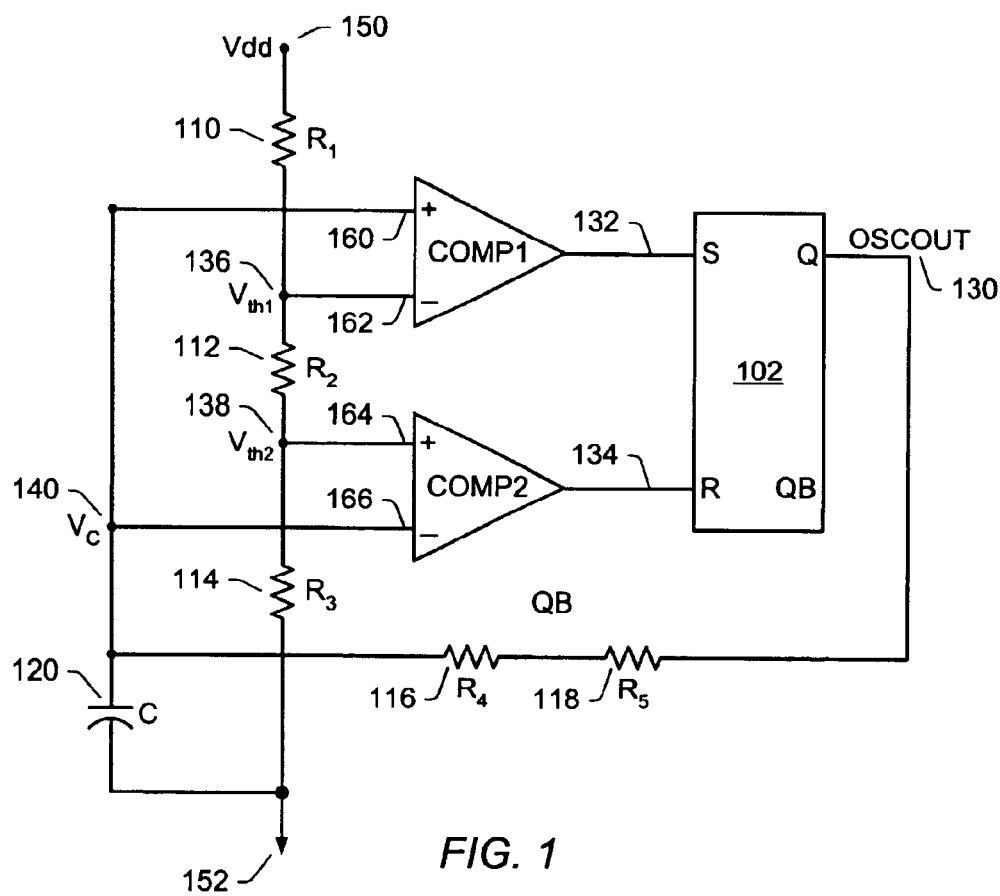
FIG. 1 illustrates one embodiment of an integrated oscillator circuit proposed by the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

DETAILED DESCRIPTION OF THE PREFERRED EMBODIMENTS

As used herein, "structure type" refers to the physical structure of an individual resistive element, or resistor implemented on an integrated circuit for a given process. For example, for a given CMOS process a resistor may be implemented to be of one of a variety of structure types, which may include n-diffusion, p-diffusion, n-well, p-well, pinched n-well, pinched p-well, poly-silicon and metal. When configured on an integrated circuit, a single "resistance" may be constructed as a single resistor or as two or more resistors connected together, where each individual resistor may be of a different structure type. When constructed of more than one resistor, the nominal value of the resistance may be equivalent to the sum of the nominal values of the resistors that make up the resistance. A "resistor string" refers to resistances connected in series, with connective taps available at the terminals of the resistances. Similarly, a "capacitance" may be constructed as a single capacitor or as two or more capacitors connected together. When constructed of more than one capacitor, the nominal value of the capacitance may be equal to the sum of the nominal values of the capacitors that make up the capacitance.

The term "integrated oscillator" refers to an oscillator whose components are configured on one integrated circuit. Furthermore, an integrated oscillator may itself be configured on one integrated circuit together with a system that uses the oscillator. The word "alternately" is meant to imply passing back and forth from one state, action, or place to another state, action, or place, respectively. For example, "alternately charging and discharging a node" would mean charging the node, then discharging the node, then charging the node, then discharging the node, and so on.

FIG. 1 illustrates one embodiment of an integrated oscillator circuit proposed by the present invention. In this embodiment, comparators COMP1 104 and COMP2 106 are coupled to inputs S 132 and R 134 of SR-Flip-Flop (SRFF) 102, respectively, where output Q of SRFF 102 represents oscillator output (OscOut) 130. A resistor string including $R_1$ 110, $R_2$ 112, and $R_3$ 114 may be connected in a configuration to generate threshold voltages $V_{th1}$ 136 and $V_{th2}$ 138. In this configuration, $R_1$ 110 couples a supply voltage $V_{dd}$ 150 to an inverting input 162 of COMP1 104, while $R_2$ 112 couples node $V_{th1}$ 136 to node $V_{th2}$ 138 itself coupled to a non-inverting input 164 of COMP2 106, and $R_3$ 114 couples node $V_{th2}$ 138 to a common ground (GND) 152. Resistors $R_4$ 116 and $R_5$ 118 may couple OscOut 130 to capacitor C 120, with the other terminal of C 120 connected to GND 152. In one embodiment, C 120 is also coupled to node $V_c$ 140 which connects inverting input 166 of COMP2 106 and non-inverting input 160 of COMP1 104. SRFF 102 operates to drive the charging and discharging of C 120 through $R_4$ 116 and $R_5$ 118. By keeping the voltage across C 120 within the bounds established by $V_{th1}$ 136 and $V_{th2}$ 138, stable operation of the oscillator may be achieved.

Referring again to FIG. 1, threshold voltages measured at node $V_{th1}$ 136 and node $V_{th2}$ 138 may be expressed as follows:

$$V_{th1} = \frac{(R_2 + R_3)V_{dd}}{(R_1 + R_2 + R_3)} \quad (1)$$

$$V_{th2} = \frac{(R_3)V_{dd}}{(R_1 + R_2 + R_3)}. \quad (2)$$

For the oscillator shown in FIG. 1, C 120 is being charged while the voltage value measured at node $V_c$ 140 changes from being equivalent to the voltage value measured at node $V_{th2}$ 138 to being equivalent to the voltage value measured at node $V_{th1}$ 136. A time period ($T_1$) elapsed during charging C 120 may be expressed by the equation:

$$T_1 = (R_5 + R_4)C\ln\left(\frac{R_1 + R_2}{R_1}\right). \quad (3)$$

Similarly, as the voltage value measured at node $V_c$ 140 changes from being equivalent to the voltage value measured at node $V_{th1}$ 136 to being equivalent to the voltage value measured at node $V_{th2}$ 138, C 120 is discharged. A time period ($T_2$) elapsed during discharging C 120 may be expressed by the equation:

$$T_2 = (R_5 + R_4)C\ln\left(\frac{R_2 + R_3}{R_3}\right). \quad (4)$$

A resulting total time period of the oscillation (T) may be expressed as:

$$T = (R_5 + R_4)C\ln\left[\left(\frac{R_2 + R_3}{R_3}\right)\left(\frac{R_1 + R_2}{R_1}\right)\right]. \quad (5)$$

The resistor values as they appear in equation (5) represent nominal values, which are prone to variations resulting from process shifts during manufacturing. The level of variation for a respective resistor will be dependent on the structure type chosen for the respective resistor. While process shifts experienced by each respective structure type may be similar, the process shift for each respective structure type may also depend on variables that do not affect any of the other process shifts. Therefore, if the resistors in equation (5) are selected to be of more than one structure type, changes in nominal values of the different resistors may be considered separately and grouped by structure type. In other words, a process shift associated with a respective structure type may be considered as contributing to a change in value of a resistor of the respective structure type independently from a process shift associated with another structure type contributing to a change in value of a resistor of the other structure type. From equation (5) it follows that a change in nominal resistor value results in a change in the period of oscillation (T).

As indicated by equations (1) and (2), (and also equations (10) and (11) below) selection of the nominal resistor values for the resistor string may determine threshold voltages $V_{th1}$ 136 and $V_{th2}$ 138. For example, in a first embodiment, the value of $R_2$ 112 may be chosen to be twice the value of $R_1$ 110 and also twice the value of $R_3$ 114, resulting in the value of $V_{th1}$ equaling three-fourths the value of $V_{dd}$, or $3/4*V_{dd}$, and the value of $V_{th2}$ equaling one-fourth the value of $V_{dd}$, or $1/4*V_{dd}$, nominally. Similarly, in a second embodiment, an equal value each for $R_1$ 110, $R_2$ 112, and $R_3$ 114 may be selected, which would result in the value of $V_{th1}$ equaling $2/3*V_{dd}$, and the value of Vth$_2$ equaling $1/3*V_{dd}$, nominally. In the first embodiment mentioned above, COMP2 106 has to operate reliably for a lower common mode voltage close to GND 152 than in the second embodiment. Also, since $V_{th1}$ 136 is higher in the first embodiment than in the second embodiment, COMP1 104 has to operate reliably for a higher common mode voltage close to $V_{dd}$ 150 in the first embodiment than in the second embodiment. For lower values of $V_{dd}$, considering process corners and supply variations, threshold voltages $V_{th1}$ 136 and $V_{th2}$ 138 may move further, which may result in further constraints on the design of COMP1 104 and COMP2 106. Therefore, the second embodiment cited above may be preferred in some cases, though the first embodiment may also be implemented, and other embodiments may use a variety of different values for $R_1$, $R_2$, and $R_3$.

In one embodiment, different structure types (Type 1 and Type 2) are selected for resistors $R_1$, $R_2$, $R_3$, $R_4$, and $R_5$, such that $R_1$=R (Type 1), $R_2$=R (Type 1), an (Type 1), where 'R' represents a nominal value of each resistor in the resistor string, and $R_4$=$R^{ext}$/2 (Type 2) and $R_5$=$R_{ext}$/2 (Type 1), where '$R_{ext}$/2' represents a nomi of each resistor outside the resistor string. In other words, $R_1$, $R_2$, $R_3$, and $R_5$ may be selected to be of structural Type 1, while $R_4$ may be selected to be of structural Type 2. Considering equation (5), 'R' may be substituted for $R_1$, $R_2$, and $R_3$, and similarly, '$R_{ext}$/2' may be substituted for $R_4$ and $R_5$. Following from equation (5) the resulting oscillation period T may then be nominally written as:

$$T = R_{ext}C\ln[4]. \quad (6)$$

In order to describe process variation, a standard deviation term may be needed for each mean value represented by 'R' and '$R_{ext}$' respectively. The standard deviation term may be referred to as a fractional term or a percentage value with respect to the mean value. It is customary for those skilled in the art to account for a process shift of up to 3 times the standard deviation, which is symbolically specified as "3-sigma". The fractional 3-sigma process shift of a Type 1 resistor may be designated as $\Delta_1$ and the fractional 3-sigma process shift of a Type 2 resistor may be designated as $\Delta_2$. For example, the actual value for a Type 1 resistor with process shift may now be expressed as $R_{actual}$=$R*(1+\Delta_1)$. The oscillation period for Type 1 resistor variation may then be expressed as:

$$T + \Delta T_1 = R_{ext}C\left(1 + \frac{\Delta_1}{2}\right)\ln[4], \quad (7)$$

and the oscillation period for Type 2 resistor variation may be expressed as:

$$T + \Delta T_2 = R_{ext}C\left(1 + \frac{\Delta_2}{2}\right)\ln[4]. \quad (8)$$

In equation (8) $\Delta T_1$ and $\Delta T_2$ represent the individual and independent contributions of the process shift of structure Type 1 and the process shift of structure Type 2 to the overall change in oscillation frequency. The overall change in the period of oscillation ($\Delta T$) for both of those events according to an extended central limit theorem for statistically uncorrelated, or independent, events may be expressed as:

$$\Delta T = \sqrt{(\Delta T_1)^2 + (\Delta T_2)^2}. \quad (9)$$

Figure 2:
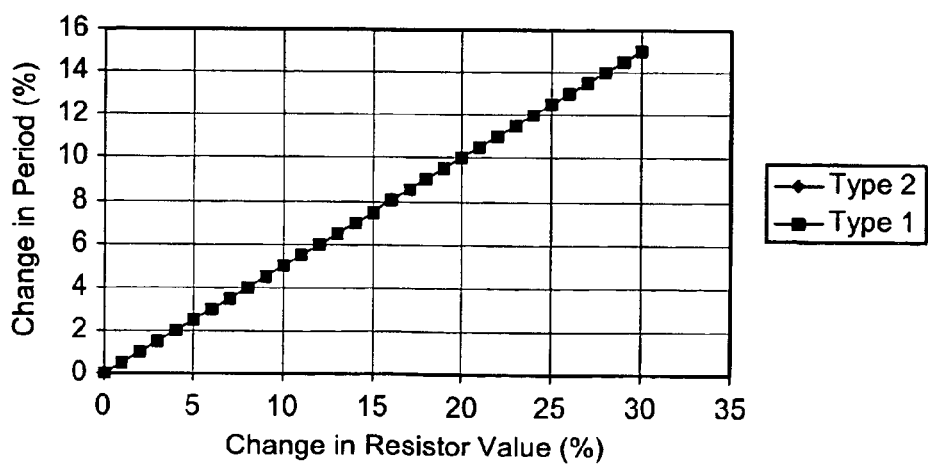
FIG. 2 illustrates a chart depicting frequency variation with respect to process shift of individual resistor types as pertaining to the embodiment of the integrated oscillator shown in FIG. 1.

FIG. 2 shows a chart illustrating frequency variation with respect to process shift of individual resistor types as pertaining to the embodiment of the oscillator shown in FIG. 1.

The horizontal axis represents a percent change in resistor value due to the process shift, and the vertical axis represents a percent change in the period of oscillation of the oscillator output. As expressed in the chart, if for example both Type 1 and Type 2 show a 20% process shift, then the corresponding change in period of oscillation for both types is 10%, respectively. The overall change in the period of oscillation may be expressed as the square root of the sum of squares of both shifts, which for the aforementioned values would come to a value of 14.14% when considering both process shifts from FIG. 2.

Figure 3:
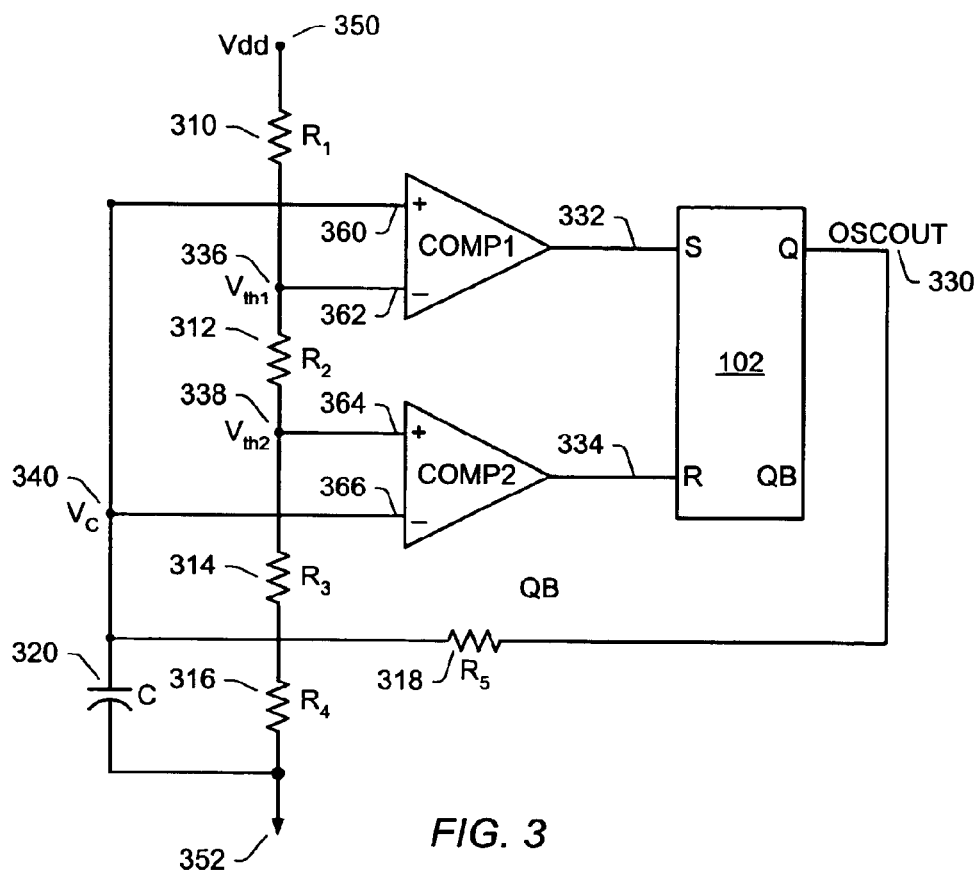
FIG. 3 illustrates an alternate embodiment of an integrated oscillator circuit proposed by the present invention.

FIG. 3 illustrates another embodiment of an integrated oscillator circuit proposed by the present invention. In this embodiment, comparators COMP1 304 and COMP2 306 are coupled to inputs S 332 and R 334 of SRFF 302, respectively, where output Q of SRFF 302 represents OscOut 330. A resistor string including $R_1$ 310, $R_2$ 312, $R_3$ 314, and $R_4$ 316 may be connected in a configuration to generate threshold voltages $V_{th1}$ 336 and $V_{th2}$ 338. In this configuration, $R_1$ 310 couples a supply voltage $V_{dd}$ 350 to an inverting input 362 of COMP1 304, while $R_2$ 112 couples node $V_{th1}$ 336 to node $V_{th2}$ 338 itself coupled to a non-inverting input 364 of COMP2 306, and $R_3$ 114 couples node $V_{th2}$ 338 to $R_4$ 316, which is then coupled to GND 352. Resistor $R_5$ 318 may couple OscOut 330 to capacitor C 320, with the other terminal of C 320 connected to GND 352. In one embodiment, C 320 is also coupled to node $V_c$ 340 which connects inverting input 366 of COMP2 306 and non-inverting input 360 of COMP1 304. SRFF 302 operates to drive the charging and discharging of C 320 through $R_5$ 318. By keeping the voltage across C 320 within the bounds established by $V_{th1}$ 336 and $V_{th2}$ 338, stable operation of the oscillator may be achieved, similar to the operation of the oscillator in the embodiment of FIG. 1.

Referring again to FIG. 3, threshold voltages measured at node $V_{th1}$ 336 and node $V_{th2}$ 338 may be expressed as follows:

$$V_{th1} = \frac{(R_2 + R_3 + R_4)V_{dd}}{(R_1 + R_2 + R_3 + R_4)} \quad (10)$$

$$V_{th2} = \frac{(R_3 + R_4)V_{dd}}{(R_1 + R_2 + R_3 + R_4)}. \quad (11)$$

As seen from FIG. 3 and equations (10) and (11), $R_3$ 314 and $R_4$ 316 may together functionally represent a single resistor when considering the voltage distribution at nodes $V_{th1}$ 336 and $V_{th2}$ 338. For the oscillator shown in FIG. 3, C 320 is being charged in a manner similar as described for C 120 in the oscillator of FIG. 1. In other words, C 320 is charged while the voltage value measured at node $V_c$ 340 changes from being equivalent to the voltage value measured at node $V_{th2}$ 338 to being equivalent to the voltage value measured at node $V_{th1}$ 336. A time period ($T_1$) elapsed during charging C 320 may be expressed by the equation:

$$T_1 = R_5 C \ln\left(\frac{R_1 + R_2}{R_1}\right). \quad (12)$$

Similarly, as the voltage value measured at node $V_c$ 340 changes from being equivalent to the voltage value measured at node $V_{th1}$ 336 to being equivalent to the voltage value measured at node $V_{th2}$ 338, C 320 is discharged. A time period ($T_2$) elapsed during discharging C 320 may be expressed by the equation:

$$T_2 = R_5 C \ln\left(\frac{R_2 + R_3 + R_4}{R_3 + R_4}\right). \quad (13)$$

A resulting total time period of the oscillation (T) may be expressed as:

$$T = R_5 C \ln\left[\left(\frac{R_2 + R_3 + R_4}{R_3 + R_4}\right)\left(\frac{R_1 + R_2}{R_1}\right)\right]. \quad (14)$$

Performing an analysis similar to that performed for the oscillator in the embodiment shown in FIG. 1, different structure types (Type 1 and Type 2) may again be selected for resistors $R_1$, $R_2$, $R_3$, $R_4$, and $R_5$. In one embodiment, $R_1$=R (Type 1), $R_2$'(Type 2), $R_3$=R/2 (Type 1), and $R_4$=R/2 (Type 2) where 'R' represents a nominal value of each resistor in the resistor string, and $R_5$=$R_{ext}$ (Type 1) where '$R_{ext}$' represents a nominal value of the resistor outside the resistor string. As described above, compensating for effects of process shift in the charging/discharging time of C 320 may be accomplished by varying the threshold levels of the comparators through the selection of different types for respective resistors in the resistor string, where, for example, $R_3$ 314 and $R_4$ 316 may together be considered as one functional element divided into two parts, each part being of a different structure type. Therefore, considering equation (14), 'R' may be substituted for $R_1$ and $R_2$, 'R/2' may be substituted for $R_3$ and $R_4$, and similarly, '$R_{ext}$' may be substituted for $R_5$. Following from equation (13) the resulting oscillation period T may then be nominally written as:

$$T = R_{ext} C \ln[4] \quad (15)$$

Again, in order to describe process variation, a standard deviation term may be needed for each mean value represented by 'R', and '$R_{ext}$'respectively. The fractional 3-sigma process shift of a Type 1 resistor may again be designated as $\Delta_1$ and the fractional 3-sigma process shift of a Type 2 resistor may again be designated as $\Delta_2$. The oscillation period for Type 1 resistor variation may then be expressed as:

$$T + \Delta T_1 = R_{ext} C(1 + \Delta_1) \ln\left[\left(\frac{2 + \Delta_1/2}{1 + \Delta_1/2}\right)\left(\frac{2 + \Delta_1}{1 + \Delta_1}\right)\right], \quad (16)$$

and the oscillation period for Type 2 resistor variation may be expressed as:

$$T + \Delta T_2 = R_{ext} C \ln\left[\left(\frac{2 + 3\Delta_2/2}{1 + \Delta_2/2}\right)\left(\frac{2 + \Delta_2}{1}\right)\right]. \quad (17)$$

The overall change in the period of oscillation ($\Delta T$) for both of those events according to an extended central limit theorem for statistically uncorrelated, or independent, events may again be expressed as:

$$\Delta T = \sqrt{(\Delta T_1)^2 + (\Delta T_2)^2}. \quad (18)$$

Figure 4:
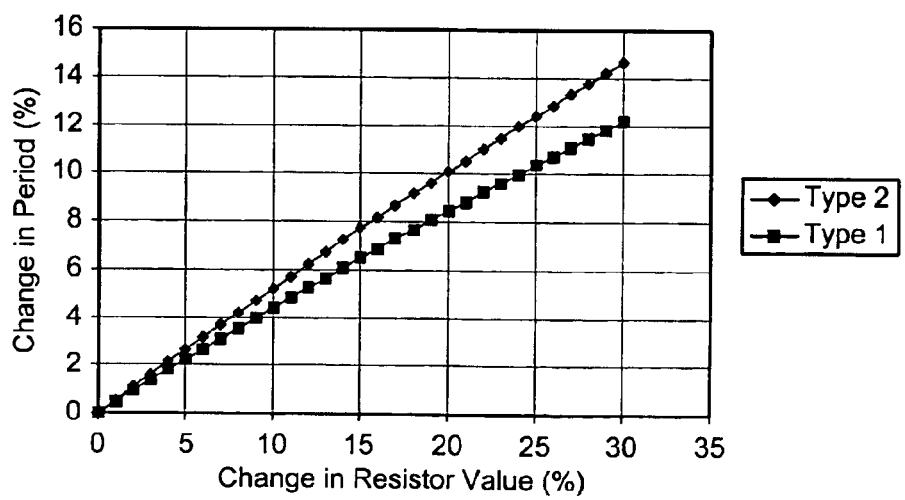
FIG. 4 illustrates a chart depicting frequency variation with respect to process shift of individual resistor types as pertaining to the embodiment of the integrated oscillator shown in FIG. 3.

FIG. 4 shows a chart illustrating frequency variation with respect to process shift of individual resistor types as pertaining to the oscillator shown in the embodiment of FIG. 3. The horizontal axis again represents a percent change in resistor value due to the process shift, and the vertical axis again represents a percent change in the period of oscillation of the oscillator output. As expressed in the chart, if both Type 1 and Type 2 show a 20% process shift, the corresponding change in period of oscillation for Type 2 is 10%, and the corresponding change in period of oscillation for Type 1 is 8.44%. Therefore, the shift in oscillation frequency for Type 1 is further reduced when compared to the shift in oscillation frequency for Type 1 in FIG. 2. The overall change in the period of oscillation may again be expressed as the square root of the sum of squares of both shifts, which for the aforementioned values would come to a value of 13% when considering both process shifts from FIG. 4. This represents a 1% improvement over the previous compounded percentage value of 14.14% (from FIG. 2), and an overall 5% improvement when compared to all resistors being of a single type.

Thus, various embodiments of the systems and methods described above may facilitate design of an integrated relaxation oscillator that exhibits minimal change in the frequency of oscillation caused by process variation, thereby minimizing the area requirements for capacitor banks and/or resistor banks used during trimming.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

What is claimed is:

1. An oscillator with improved sensitivity to component variation due to process shift, comprising:
    a first comparator circuit and a second comparator circuit;
    a charging-discharging circuit coupled to a first input of the first comparator circuit and to a first input of the second comparator circuit;
    a resistor string coupled to a second input of the first comparator circuit and to a second input of the second comparator circuit;
    a latch configured to combine an output of the first comparator circuit and an output of the second comparator circuit;
    wherein the resistor string is operable to maintain a first reference voltage at the second input of the first comparator circuit and a second reference voltage at the second input of the second comparator circuit;
    wherein the first reference voltage is substantially higher than the second reference voltage;
    wherein an output of the latch is coupled to the charging-discharging circuit, forming a feedback loop;
    wherein the output of the first comparator circuit is operable to change states when the first input of the first comparator circuit reaches a voltage level substantially commensurate with the first reference voltage;
    wherein the output of the second comparator circuit is operable to change states when the first input of the second comparator circuit reaches a voltage level substantially commensurate with the second reference voltage;
    wherein the charging-discharging circuit is operable to charge the first input of the first comparator circuit and the first input of the second comparator circuit to a voltage level substantially commensurate with the first reference voltage;
    wherein the charging-discharging circuit is operable to discharge the first input of the first comparator circuit and the first input of the second comparator circuit to a voltage level substantially commensurate with the second reference voltage; and
    wherein the resistor string comprises at least two different structure types.

2. The oscillator of claim 1, wherein the charging-discharging circuit comprises:
    a resistance; and
    a capacitance coupled to the resistance;
    wherein the resistance and the capacitance are configured together to substantially determine a time period of oscillation of the oscillator.

3. The oscillator of claim 2, wherein the resistance comprises at least two different structure types.

4. The oscillator of claim 3, wherein a first of the at least two different structure types comprises poly-silicon, and a second of the at least two different structure types comprises n+ diffusion.

5. The oscillator of claim 2;
    wherein the first input of the first comparator circuit and the first input of the second comparator circuit are both coupled to a first terminal of the capacitance; and
    wherein a second terminal of the capacitance is coupled to a common ground.

6. The oscillator of claim 1, wherein the resistor string comprises a first resistance, a second resistance, and a third resistance;
    wherein the first resistance couples a power supply to the second input of the first comparator circuit;
    wherein the second resistance couples the second input of the first comparator circuit to the second input of the second comparator circuit;
    wherein the third resistance couples the second input of the second comparator circuit to a common ground; and
    wherein the first resistance comprises a first structure type, the second resistance comprises a second structure type different from the first structure type, and the third resistance comprises the first structure type and the second structure type.

7. The oscillator of claim 6;
    wherein a nominal value of the first resistance, a nominal value of the second resistance and a nominal value of the third resistance are substantially equivalent to each other.

8. The oscillator of claim 1, wherein the latch comprises an SR-latch.

9. The oscillator of claim 1, wherein a first of the at least two different structure types comprises poly-silicon, and a second of the at least two different structure types comprises n+ diffusion.

10. An oscillator with improved sensitivity to component variation due to process shift, comprising:
    a first comparator circuit and a second comparator circuit;
    a resistor string coupled to a second input of the first comparator circuit and to a second input of the second comparator circuit;
    a latch configured to combine an output of the first comparator circuit and an output of the second comparator circuit;
    a resistance coupling an output of the latch to a first input of the first comparator circuit and to a first input of the second comparator circuit;
    a capacitance coupling a common ground to the first input of the first comparator circuit and to the first input of the second comparator circuit;

wherein the resistor string is operable to maintain a first reference voltage at the second input of the first comparator circuit and a second reference voltage at the second input of the second comparator circuit;

wherein the first reference voltage is substantially higher than the second reference voltage;

wherein the output of the first comparator circuit is operable to change states when the first input of the first comparator circuit reaches a voltage level substantially commensurate with the first reference voltage;

wherein the output of the second comparator circuit is operable to change states when the first input of the second comparator circuit reaches a voltage level substantially commensurate with the second reference voltage; and wherein the resistance comprises at least two different structure types.

11. The oscillator of claim 10, wherein the resistor string comprises a first resistance, a second resistance, and a third resistance;

wherein the first resistance couples a power supply to the second input of the first comparator circuit;

wherein the second resistance couples the second input of the first comparator circuit to the second input of the second comparator circuit; and wherein the third resistance couples the second input of the second comparator circuit to a common ground.

12. The oscillator of claim 11, wherein the first resistance comprises a first structure type, the second resistance comprises a second structure type different from the first structure type, and the third resistance comprises the first structure type and the second structure type.

13. The oscillator of claim 11;

wherein a nominal value of the first resistance, a nominal value of the second resistance and a nominal value of the third resistance are substantially equivalent to each other.

14. The oscillator of claim 10, wherein the latch comprises an SR-latch.

15. The oscillator of claim 10, wherein a first of the at least two different structure types comprises poly-silicon, and a second of the at least two different structure types comprises n+ diffusion.

16. A method for implementing an integrated oscillator with improved sensitivity to component variation due to process shift, the method comprising:

forming a first resistance of a first structure type;

forming a second resistance of a second structure type, wherein the second structure type is different from the first structure type;

forming a third resistance, wherein the third resistance comprises a first resistor of the first structure type and a second resistor of the second structure type;

coupling a supply voltage to a first input of a first comparator circuit through the first resistance;

coupling the first input of the first comparator circuit to a first input of a second comparator circuit through the second resistance;

coupling the first input of the second comparator circuit to a common ground through the third resistance;

coupling an output of the first comparator circuit and an output of the second comparator circuit to a latch;

coupling an output of the latch to a second input of the first comparator circuit and to a second input of the second comparator circuit through a charge-discharge circuit; and providing the output of the latch as output of the integrated oscillator.

17. The method of claim 16, wherein the latch comprises an SR-latch.

18. The method of claim 16, wherein said coupling the output of the latch comprises:

coupling the output of the latch to a first terminal of a fourth resistance;

coupling a first terminal of a capacitance to a second terminal of the fourth resistance, to the second input of the first comparator circuit, and to the second input of the second comparator circuit; and coupling a second terminal of the capacitance to the common ground.

19. The method of claim 16, wherein the first structure type comprises poly-silicon, and the second structure type comprises n+ diffusion.

20. The method of claim 16, wherein a nominal value of the first resistance, a nominal value of the second resistance and a nominal value of the third resistance are substantially equivalent to each other.

* * * * *